United States Patent [19]

Kawauchi

[11] Patent Number: 5,313,523
[45] Date of Patent: May 17, 1994

[54] SOUND VOLUME CONTROLLING APPARATUS

[75] Inventor: Yoshihiro Kawauchi, Hino, Japan

[73] Assignee: Kabushiki Kaisha Toshiba, Kanagawa, Japan

[21] Appl. No.: 92,580

[22] Filed: Jul. 16, 1993

Related U.S. Application Data

[63] Continuation of Ser. No. 799,347, Nov. 27, 1991, abandoned.

[30] Foreign Application Priority Data

Nov. 28, 1990 [JP] Japan .................................. 2-327558

[51] Int. Cl.$^5$ .............................................. H03G 3/00
[52] U.S. Cl. .................................... 381/104; 381/109;
381/68.4; 379/395; 379/390; 379/325; 84/665;
84/633; 84/711; 368/245; 368/187
[58] Field of Search ................. 381/109, 104, 68.4;
379/395, 390, 375, 373, 374; 84/633, 665, 711;
368/245, 187

[56] References Cited

U.S. PATENT DOCUMENTS 4,611,344  9/1986  Hayama et al. ...................... 381/109
4,975,949  12/1990 Wimsatt et al. ...................... 379/395

FOREIGN PATENT DOCUMENTS 0146007  7/1986  Japan .................................. 381/109

Primary Examiner—John K. Peng
Assistant Examiner—Nina Tong
Attorney, Agent, or Firm—Finnegan, Henderson, Farabow, Garrett & Dunner

[57] ABSTRACT

The sound volume controlling apparatus comprises UP and DOWN keys (42, 43) depressed manually; a time period detecting circuit (39h, 39d) for detecting time period from when the duration of UP or DOWN key depression reaches a predetermined value (e.g. 0.5 sec) to when the continuous key depression ends; a sound volume value deciding circuit (39e, 39f, 37a) for changing the sound volume value during the time duration detected by the time period detecting circuit; and sound volume changing circuit (37b, 45) for changing the sound volume in accordance with the value decided by the sound volume value deciding circuit.

Since the sound volume is changed only after the key is kept depressed for a predetermined time period (e.g. 0.5 sec), it is possible to prevent the sound volume from being changed erroneously due to a short time touch to the keys.

14 Claims, 19 Drawing Sheets

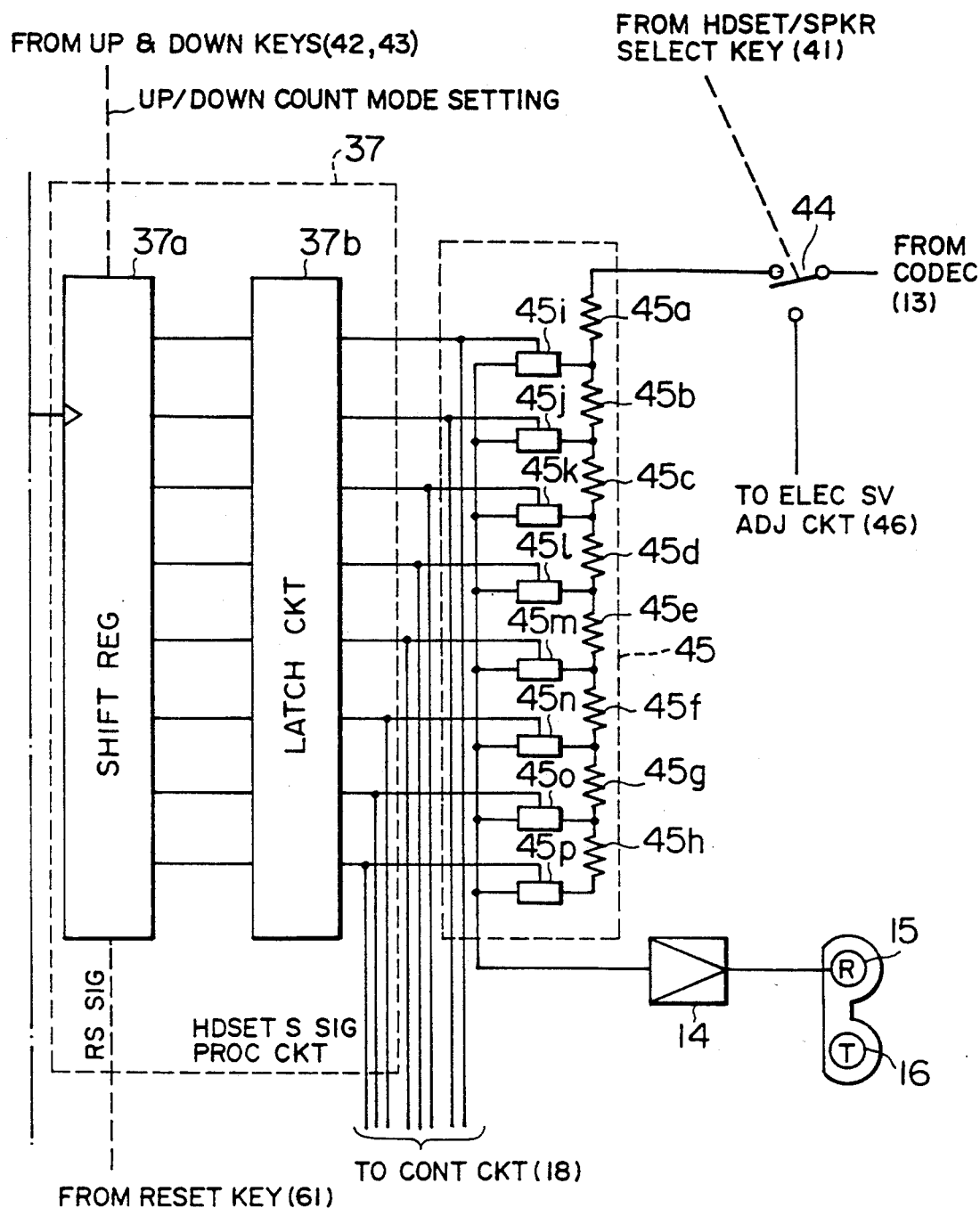
F I G. 4B

SOUND VOLUME CONTROLLING APPARATUS

This application is a continuation of application Ser. No. 07/799,347, filed Nov. 27, 1991, now abandoned.

BACKGROUND OF THE INVENTION

The present invention relates to a sound volume controlling apparatus suitable for use in telephone systems or audio systems, and more specifically to a sound volume controlling apparatus provided with sound volume controlling keys for increasing or decreasing sound volume when depressed.

A sound volume controlling apparatus incorporated in a telephone set to which receives speech sound or a ringing sound includes sound volume "UP" and "DOWN" keys. In the above-mentioned apparatus, whenever the "UP" key is depressed, sound volume increases stepwise, beginning from the key depression moment, at a constant rate as shown in FIG. 1. On the other hand, whenever the "DOWN" key is depressed, sound volume decreases stepwise, beginning from the key depression moment, at the constant rate.

A problem exists in the above-mentioned apparatus, however, because sound volume starts to increase or decrease the instant that the "UP" or "DOWN" key is depressed, even when the user or something touches these keys erroneously. Thus, even if erroneously depressed, the sound volume keys cause the sound volume inevitably change.

SUMMARY OF THE INVENTION

Therefore, the object of the present invention is to provide a sound volume controlling apparatus which can prevent sound volume from being changed when the user or something erroneously touches sound volume controlling keys.

To achieve the above-mentioned object, the present invention provides a sound volume controlling apparatus, comprising: key means operable manually; time period detecting means coupled to the key means, for detecting the time period from when duration of operation of the key means reaches a predetermined time to when the continuous operation of the key means ends; sound volume value deciding means coupled to the time period detecting means, for changing sound volume value during the time duration detected by the time period detecting means; and deciding means, for changing the sound volume in accordance with the sound volume value decided by the sound volume value deciding means.

DESCRIPTION OF THE PREFERRED EMBODIMENTS

An embodiment of the present invention will be described hereafter with respect to its application to extension telephone sets in a key telephone system, in order to control received speech sound volume and ringing sound volume.

Figure 1:
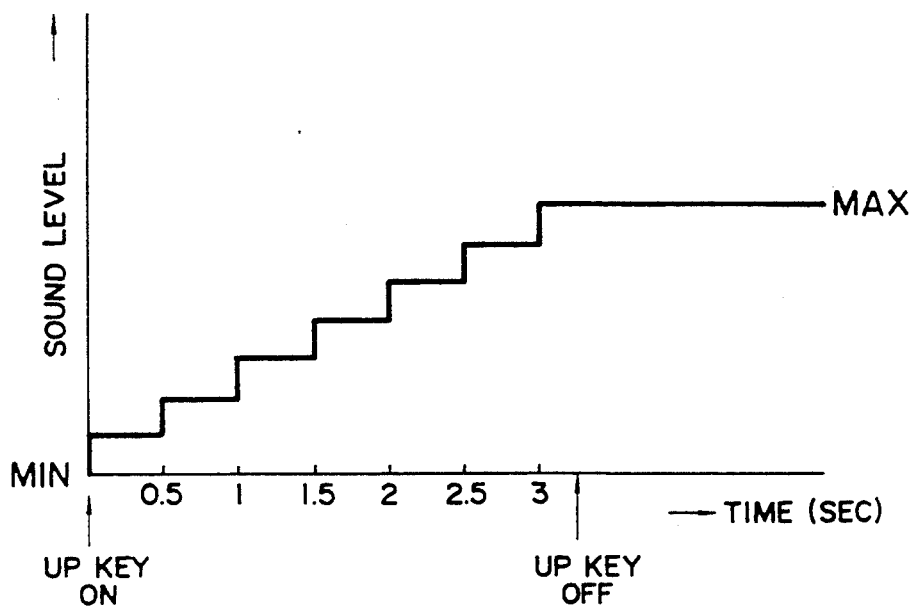
FIG. 1 is a graphical representation for assistance in explaining the prior art sound volume control.
Figure 2A:
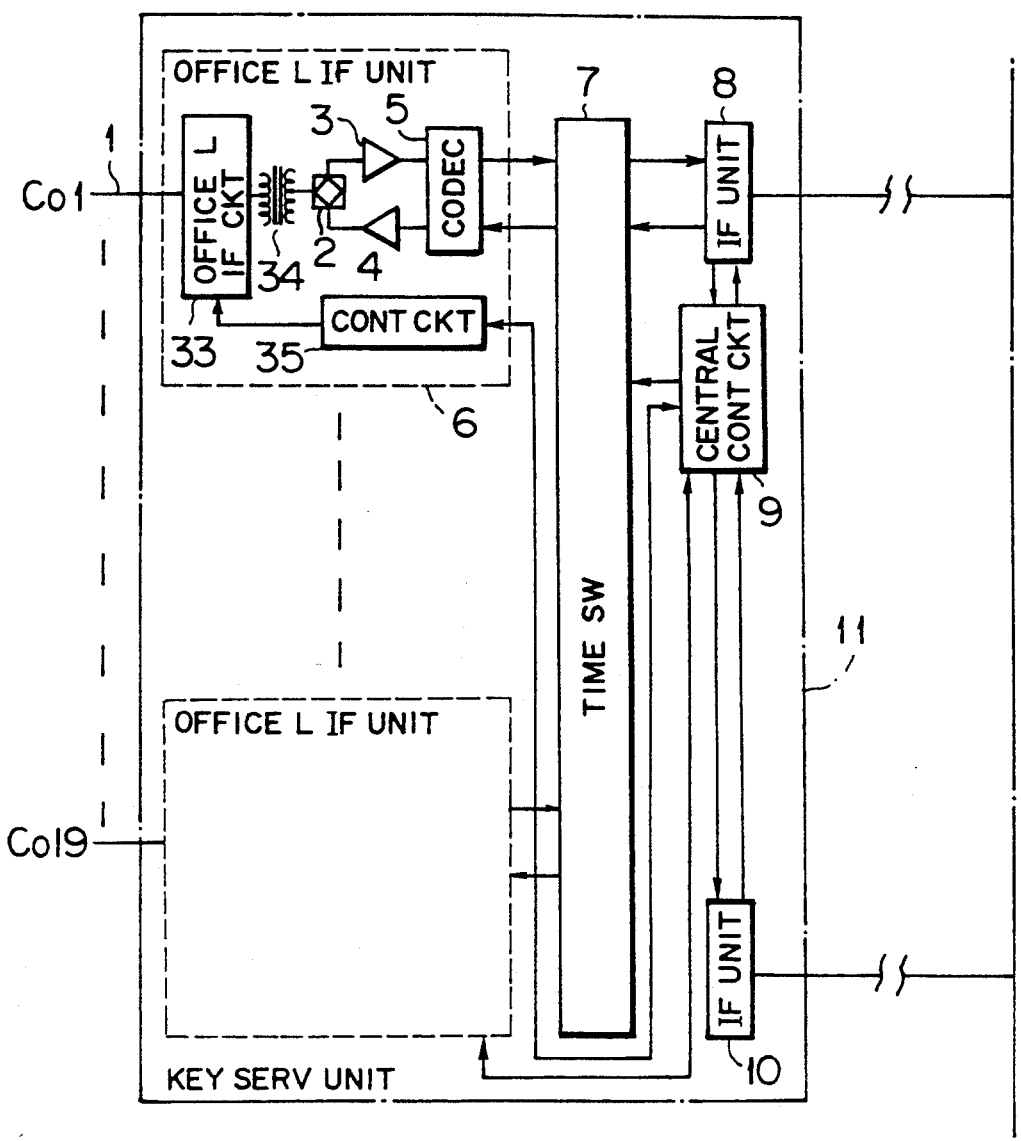
FIG. 2 (including FIGS. 2A and 2B) is a block diagram showing the entire embodiment of the present invention is incorporated.
Figure 2:
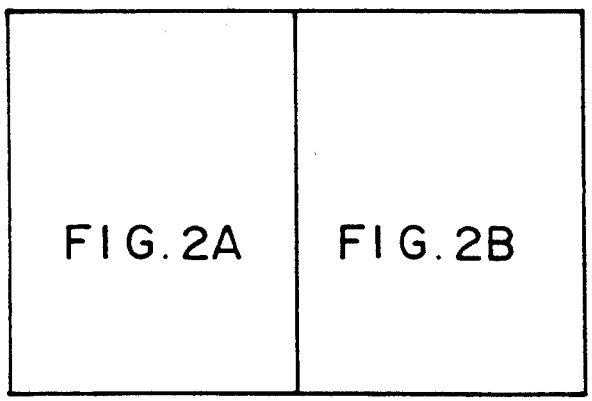

FIG. 2 (including FIGS. 2A and 2B) is a block diagram showing the entire configuration of a key telephone system. As shown, the key telephone system generally includes a key service unit 11 and a plurality of key telephone sets 22 and 23 (only two sets are shown) connected to the key service unit 11. Further, these telephone sets 22 and 23 include "UP" keys 42 and 54 and "DOWN" keys 43 and 55, respectively to control received speech sound volume and ringing sound volume.

The key service unit 11 is composed of an office line interface unit 6 connected to an office line 1; key telephone set interface units 8 and 10 connected to the key telephone sets 22 and 23, respectively; a time switch 7; and a central control circuit 9 for controlling the office line interface unit 6, the time switch 7, and the key telephone set interface units 8 and 10, respectively.

The above construction will be described hereinbelow in further detail. The office line interface unit 6 is provided to connect the key service unit 11 to the office line 1, and includes an office line interface circuit 33, a transformer 34, hybrid coil (2–4 wire switching) circuit 2, a receiving amplifier 3, a transmitting amplifier 4, a codec 5, and a control circuit. The office line interface circuit 33 detects an incoming call from the office line 1, opens/closes a dc loop of the office line, and transmits numerical signals under control of the control circuit 35. The transformer 34 is provided to couple the office line interface circuit 33 to the hybrid coil circuit 2.

The hybrid coil circuit 2 receives analog speech signals given from the office line interface circuit 33 via the transformer 34, and outputs the received speech signals to the receiving amplifier 3. Further, the hybrid coil circuit 2 receives analog speech signals outputted by the transmitting amplifier 4, and transmits the received speech signals to the office line interface circuit 33 via the transformer 34.

The receiving amplifier 3 amplifies the analog speech signals given by the 2-4 wire switching circuit 2, and outputs the amplified signals to the codec 5. On the other hand, the transmitting amplifier 4 amplifies the analog speech signals outputted by the codec 5, and outputs the amplified signals to the 2-4 wire switching circuit 2.

The codec 5 converts the analog speech signals received from the receiving amplifier 3 to digital PCM data, and applies the converted PCM speech data to the time switch 7 via a time division channel allocated to the PCM speech data. Further, the codec 5 receives the PCM speech data outputted from the time switch 7 via the time division channel allocated thereto, converts the PCM speech data to analog speech data, and outputs the converted speech data to the transmitting amplifier 4.

The control circuit 35 controls the operation (e.g. transmission of numerical signals, open/close of a dc loop, etc.) of the office line interface circuit 33 in response to control data given by the central control circuit 9. Further, the control circuit 35 receives the detection signals (e.g. incoming call detection signal, polarity inversion detection signal, etc.) given by the office line interface circuit 33 and transmits control data corresponding thereto to the central control circuit 9.

The time switch 7 realizes the time division exchange between the inputted PCM speech data and the outputted PCM speech data. The key telephone set interface units 8 and 10 receive PCM data outputted from the time switch 7 via the time division channels allocated thereto and control data supplied from the central control circuit 9, and transmit these received data to the key telephone sets 22 and 23, respectively in accordance with ping-pong (digital) transmission method. Further, the key telephone set interface units 8 and 10 receive PCM speech data and control data transmitted from the key telephone sets 22 and 23, and transmit the PCM speech data to the time switch 7 via the allocated time division channels and the control data to the central control circuit 9, respectively.

The central control circuit 9 is provided with a microcomputer including a CPU, ROM, and RAM (all not shown). Programs, fixed data, etc. are loaded on the ROM to operate the CPU. Further, the RAM is provided with memory areas for storing the current data indicative of received speech sound volumes and ringing sound volumes of the respective key telephone sets 22 and 23.

The CPU executes various known system controlling operations (e.g. ringing and switching processing) in accordance with control programs stored in the ROM. Further, the CPU executes sound volume control processing for the respective key telephone sets 22 and 23 in accordance with the control programs.

Figure 2B:
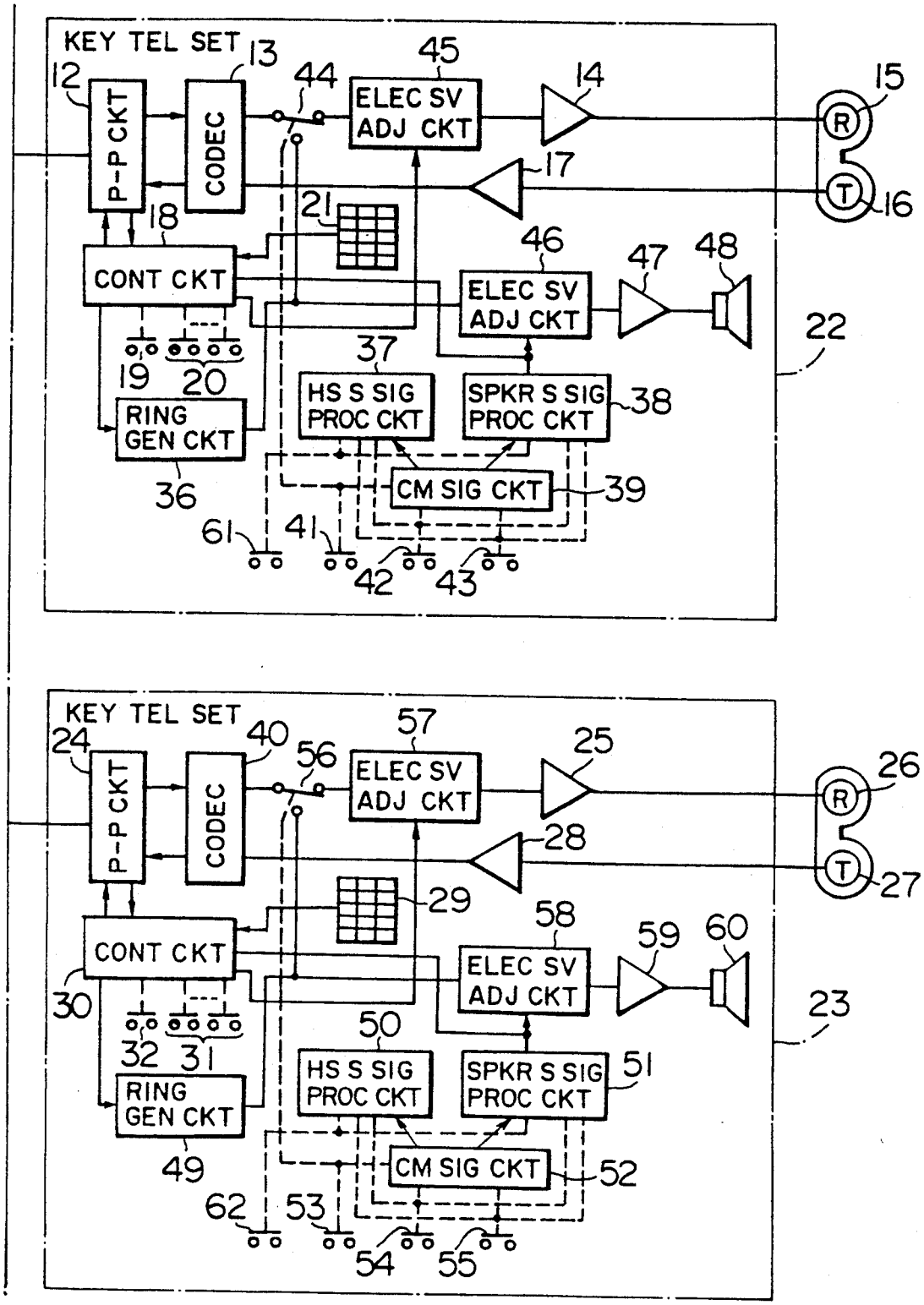

The key telephone sets 22 and 23 will be described hereafter with reference primarily to FIG. 2B. Since both the sets are the same in construction, only the key telephone set 22 is explained. The key telephone set 22 includes a ping-pong transmission circuit 12. The ping-pong transmission circuit 12 receives PCM speech data and control data transmitted from the key telephone set interface unit 8 of the key service unit 11 in accordance with the ping-pong transmission method, and transmits the PCM signals to the codec 13 and the control data to the control circuit 18. Further, the ping-pong transmission circuit 12 transmits PCM speech data outputted from the codec 13 and control data outputted from the control circuit 18 to the key telephone set interface unit 8.

The codec 13 receives PCM speech data outputted from the ping-pong transmission circuit 12 and converts the received data into analog speech signals. The converted analog speech signals are selectively inputted to either one of an electric sound volume adjusting circuit 45 or 46 by a handset/speaker change-over switch 44. When inputted to the electric sound volume adjusting circuit 45, the speech signals are transmitted to a telephone receiver 15 via a receiving amplifier 14. Further, when inputted to the electronic sound volume adjusting circuit 46, the speech signals are transmitted to a speaker 48 via an amplifier 47.

The codec 13 receives analog speech signals outputted from a telephone transmitter 16 via a transmitting amplifier 17, converts these signals into PCM speech data, and outputs these digital signals to the ping-pong transmission circuit 12.

To the control circuit 18, an extension set selecting switch 19, an office line selecting switch 20, a dial key pad 21 and a ringing sound generating circuit 36 are connected.

The extension set selecting switch 19 is used when the key telephone set 22 originates a call to another key telephone set. When this extension set selecting switch 19 is depressed, an extension set selecting data is outputted from the control circuit 18 and transmitted to the key service unit 11. The office line selecting switches 20 are used when originating a call to an office line 1. When any office line selecting switch 20 is depressed, an office line selecting data is outputted from the control circuit 18 and transmitted to the key service unit 11.

The dial key pad 21 is used to generate numerical signals for originating a call. When any numerical key in the pad 21 is depressed, a numerical signal is formed by the control circuit 18 and transmitted to the key service unit 11.

When the control circuit 18 receives an incoming call data from the key service unit 11, the ringing sound generating circuit 36 is driven by the control circuit 18 to generate a ringing sound. The generated ringing sound is transmitted to the speaker 48 via the electronic sound volume adjusting circuit 46 and the amplifier 47.

Figure 3:
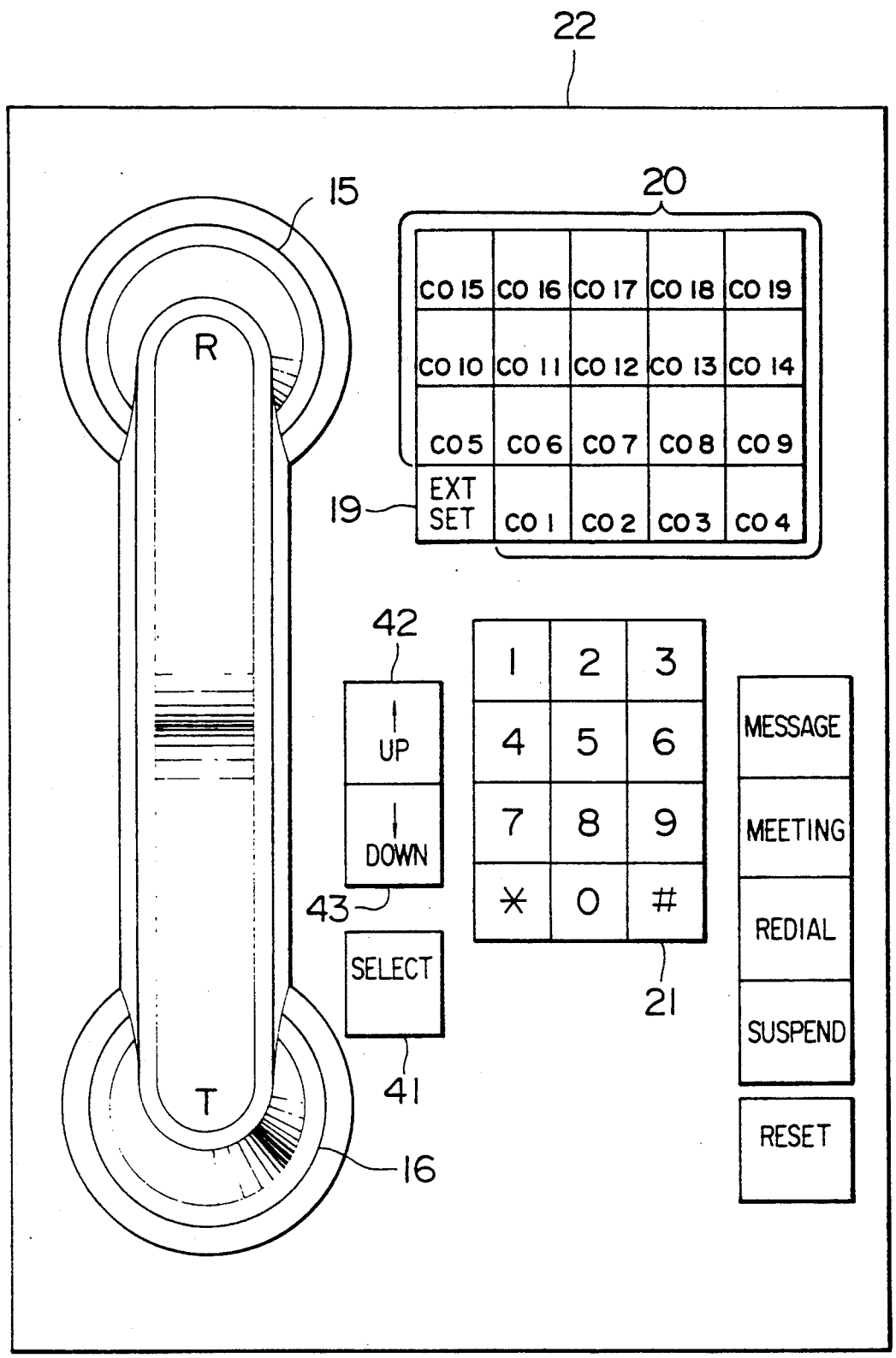
FIG. 3 is a plan view showing a front panel of the key telephone set used for the system shown in FIG. 2.

As shown in FIG. 3, a handset/speaker selecting key 41, a sound volume "UP" key 42, a sound volume "DOWN" key 43 and a reset key 61 are arranged on the front panel of the key telephone set 22, in addition to the above-mentioned extension set selecting switch 19, the office line selecting switches 20 and the dial key pad 21. In addition, a message key, a meeting key, a redial key, and a suspension key (the description of these key functions being omitted herein) are arranged on the front panel.

With reference to FIG. 2 again, the handset/speaker selecting switch 41 is used for switching the afore-mentioned handset/speaker change-over switch 44. This selecting key 41 is also used to switch an output change-over switch 39g (shown in FIG. 4A) provided in a command signal circuit 39.

The "UP" key 42 and the "DOWN" key 43 are both connected to input terminals of the command signal circuit 39. This "UP" key 42 is depressed to increase the sound volume of received speech sound or ringing sound. On the other hand, the "DOWN" key 43 is depressed to decrease the sound volume. These "UP" and "DOWN" keys are also connected to signal processing circuits 37 and 38 on the handset and speaker side. As described later, the signal processing circuits 37 and 38 are provided with a shift register which functions as an up/down counter, respectively.

These "UP" and "DOWN" keys 42 and 43 are used to set the shift register to up and down count modes, respectively.

Figure 4A:
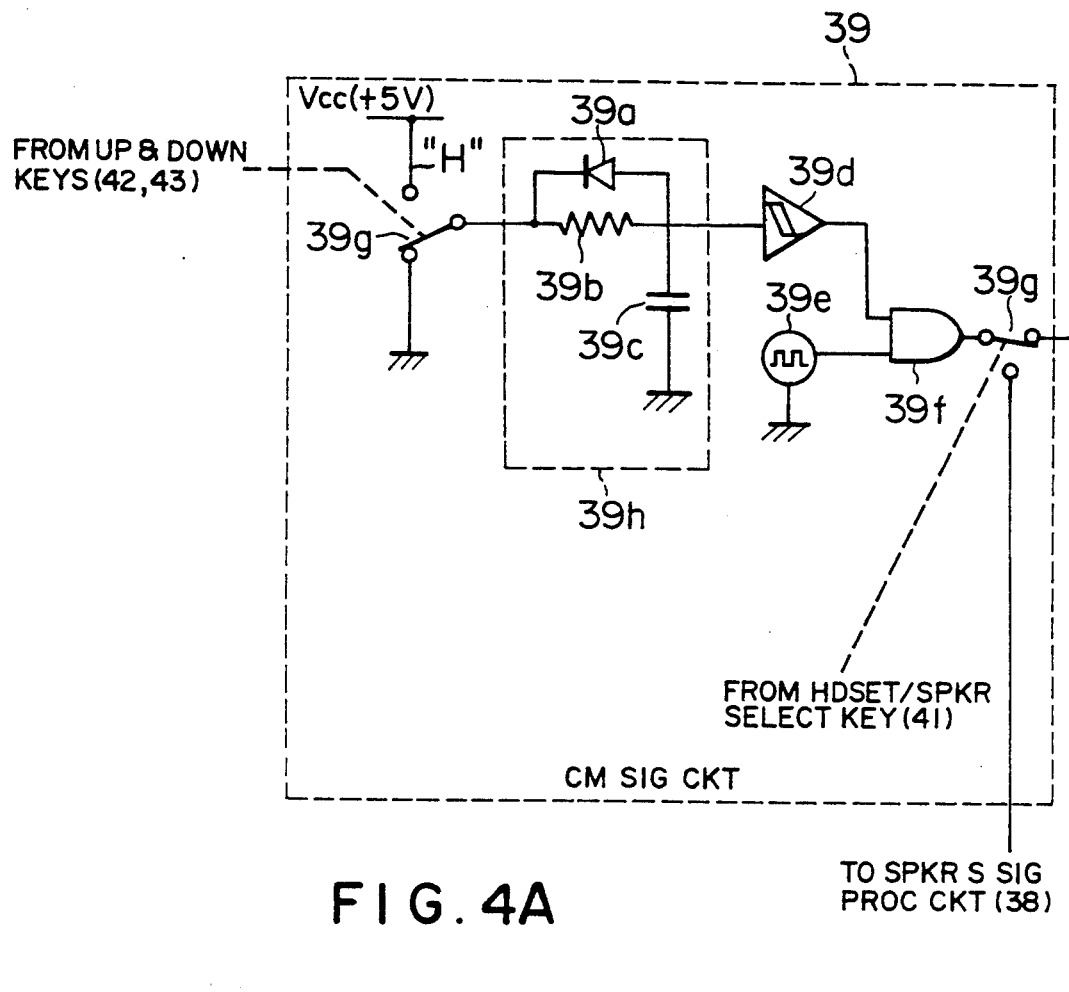
FIG. 4 (including FIGS. 4A and 4B) is a circuit diagram showing a sound volume control circuit incorporated in the key telephone set used for the system shown in FIG. 2.

In the command signal circuit 39, the input terminals thereof are connected to the "UP" and "DOWN" keys 42 and 43, and the output terminal thereof is selectively connected to either one input terminal of a handset side signal processing circuit 37 or a speaker side signal processing circuit 38 via the afore-mentioned output change-over switch 39g (shown in FIG. 4A). The command signal circuit 39 generates command signals for increasing and decreasing sound volume in response to the depression of the "UP" and "DOWN" keys 42 and 43, and outputs the command signals to the handset side or speaker side signal processing circuit 37 or 38. In this case, when the depression time of the "UP" or "DOWN" key 42 or 43 is less than a predetermined time (e.g. 0.5 sec), the command signal circuit 39 will not generate the above-mentioned command signals.

The handset and speaker side signal processing circuits 37 and 38 are the same in the inner configuration. The signal processing circuit 37 or 38 controls the sound volume value in response to the command signals given from the command signal circuit 39 to increase and decrease the sound volume, and outputs the controlled sound volume value to the electronic sound volume adjusting circuit 45 or 46 and the control circuit 18.

The electronic sound volume adjusting circuit 45 serves to adjust the sound volume of speech signals outputted from the telephone receiver 15. The electronic sound volume adjusting circuit 46 serves to adjust the sound volume of ringing signal or received speech signals outputted from the speaker 48. The electronic sound volume adjusting circuits can adjust sound volume to two mutually different values.

Figure 4:
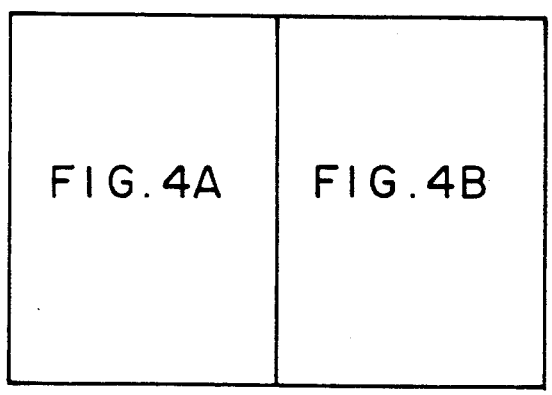

FIG. 4 (Including FIGS. 4A and 4B) is block diagram showing the internal configurations of the command signal circuit 39, the handset side signal processing circuit 37 and the electronic sound volume adjusting circuit 45 provided in the key telephone set 22. As already described, the handset and speaker side signal processing circuits 37 and 38 are the same in the internal configuration. Further, the electronic sound volume adjusting circuits 45 and 46 (FIG. 2B) are the same in the internal configuration. Therefore, it is possible to understand the configuration of the speaker side signal processing circuit 38 and the electronic sound volume adjusting circuit 46, with reference to FIG. 4.

In FIG. 4A, the command signal circuit 39 is provided with an integration circuit 39h, a Schmitt trigger circuit 39d, a clock pulse generating circuit 39e an AND circuit 39f and an output change-over switch 39d. In FIG. 4B the handset side signal processing circuit 37 is provided with a shift register 37a, and a latch circuit 37b. The electronic sound volume adjusting circuit is a resistor ladder circuit composed of a series-connected resistors 45a, 45b, 45c, 45d, 45e, 45f, 45g and 45h and analog switches 45i, 45j, 45k, 45l, 45m, 45n, 45o and 45p connected to the resistors, respectively.

These circuits will be described in more detail hereafter. In the command signal circuit 39, when the "UP" or "DOWN" key is being depressed, since a supply voltage ($V_{cc}$) side contact of the switch 39g is closed, a logical "H" level voltage signal is applied to the integration circuit 39h. The integration circuit 39h is composed of a resistor 39b, a capacitor 39c and a diode 39a. The applied voltage signal is integrated in accordance with a time constant determined by the values of the resistor 39 and the capacitor 39c and then applied connected to the integration circuit 39h with the anode 39h and with the cathode thereof connected to the input terminal thereof.

When the "UP" or "DOWN" key 42 or 43 is released from depression, the diode 39a discharges the electric charge stored in the capacitor 39c in a short time. The waveform of the output signal of the integration circuit 39h is shown in FIG. 5A.

Figure 5:
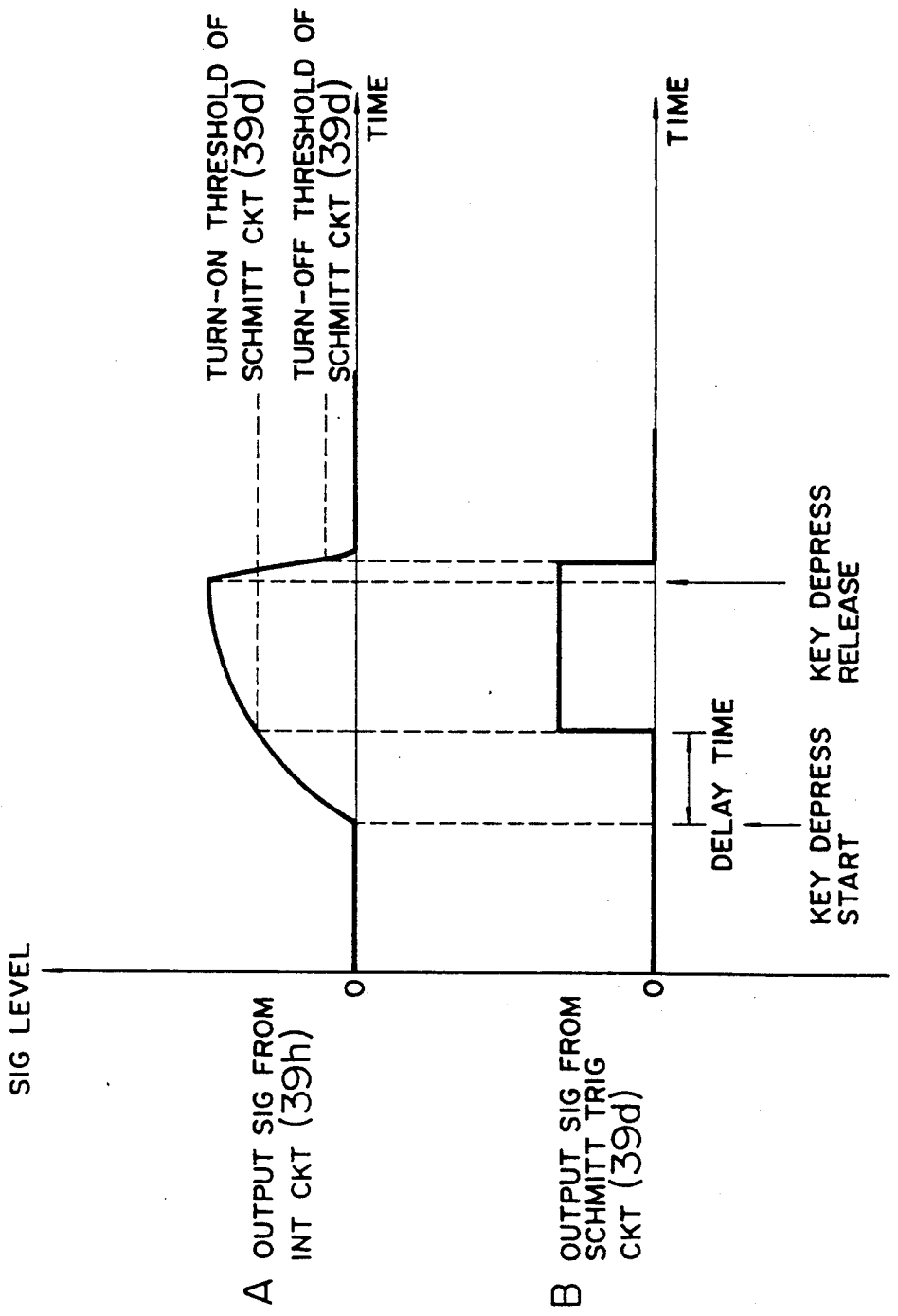
FIG. 5 is a graphical representation for assistance in explaining the operation of an integration circuit and a Schmitt circuit included in the control circuit shown in FIG. 4.

The Schmitt trigger circuit 39d forms a square pulse signal as shown in FIG. 5B in response to the signal outputted from the integration circuit 39h as shown in FIG. 5A. The formed square pulse signal is applied to one input terminal of the AND circuit 39f.

Here, when the time during which the key is depressed is shorter than a delay time determined in dependence upon the time constant of the integration circuit 39h and the turn-on threshold level of the Schmitt trigger circuit 39d, the Schmitt trigger circuit 39d is not turned on. Only when the key depression time is longer than the above delay time, is the Schmitt trigger circuit 39d turned on to apply a square pulse signal to the AND circuit 39f. The above-mentioned delay time duration can be determined by selecting the values of the resistor 39b and the capacitor 39c of the integration circuit 39h and the turn-on threshold value of the Schmitt trigger circuit 39d. Owing to this delay time, the sound volume control function will not be effected, in case the user touches the "UP" and "DOWN" keys, erroneously. It may be appropriate to determine this delay time 1 sec or less (e.g. 0.25 to 0.5 sec) from the practical standpoint.

When the square pulse signal is being applied from the Schmitt trigger circuit 39d to the AND circuit 39f, the AND circuit 39f passes a clock pulse signal from the clock pulse generating circuit 39e to apply it to a clock terminal of the shift register 37a. Since the clock pulse generating circuit 39e is so designed that the period of the clock pulse signal is adjustable, it is possible to adjust the change rate of the resistance value of the electronic sound volume adjusting circuit 45. By adjusting the change rate of the resistance value of the electronic sound volume adjusting circuit 45 according to the types of the telephone transmitter (e.g. carbon microphone, dynamic microphone, etc.), the difference in the input-output characteristics of speech signals between various transmitters can be compensated for, in such a way that the gain of the receiving amplifier 14 or the gain of the speaker amplifier 47 can be changed substantially linearly.

The output change-over switch 39g selectively connects the output terminal of the AND circuit 39f to one of the handset side signal processing circuit 37 and the speaker side signal processing circuit 38 in accordance with the depression of the handset/speaker select key 41.

The shift register 37a of 8 stages shifts a logical "H" level signal held at any one of the stages to the succeeding stage whenever the clock pulse signal from the AND circuit 39f is applied to the clock input terminal of the shift register 37a. The output terminals of the 8 stages are connected to data input terminals of the latch circuit 37b, respectively. Since the shift register 37a is provided with a function as an UP/DOWN counter, when the "UP" key 42 is depressed, a mode setting signal of logical "H" level is applied to the shift register 37a, so that the shift register 37a is set to an UP count mode. In this UP count mode, the held logical "H" level signal is shifted in the upward direction shown in FIG. 4 in response to the clock pulse signals from the AND circuit 39f. When the "DOWN" key 43 is depressed, a mode setting signal of logical "L" level is applied to the shift register 37a, so that the shift register 37a is set to a DOWN count mode. In this DOWN count mode, the held logical "H" level signal is shifted in the downward direction shown in FIG. 4 in response to the clock pulse signals from the AND circuit 39f. The number of shifted stages is determined by the number of the clock pulse signals (the number of leading edges thereof) outputted by the clock pulse generating circuit 39e within a time period of the square wave signal outputted from the Schmitt trigger circuit 39d.

This shift register 37a can be reset to the initial condition in response to a reset signal applied from the reset key 61 arranged in the front panel of the key telephone set 22. In the initial condition, the logical "H" level signal is held at the middle stage (corresponding to the analog switch 45l) of the shift register 37a.

The latch circuit 37b is connected to the shift register 37a in such a way that the input terminals of the latch circuit are connected to the 8 stages of the shift register 37a via 8 signal wires. Further, the latch circuit 37b is connected to the 8 analog switches 45i to 45p via 8 signal wires, respectively. Further, the latch circuit 18 is also connected to the control circuit 18 (shown in FIG. 2). The latch circuit 37b latches a signal held at one of the 8 stages of the shift register 37a and outputs the held signal to one of the 8 analog switches 45i to 45p and the control circuit 18.

The control circuit 18 recognizes the sound volume value of received speech signals outputted from the receiving amplifier 14 by discriminating the "H" level bit position of the signals applied from the latch circuit 37b. The recognized sound volume value is given to the central control circuit 9 of the key service unit 11 through the already-mentioned route and stored in the RAM of the central control circuit 9.

Each of the analog switches 45i to 45p of the electronic sound volume adjusting circuit 45 becomes conductive when the logical "H" level signal is applied thereto from the latch circuit 37b. That is, when the logical "H" level signal is held at the first stage of the latch circuit 37b, since the analog switch 45i is conductive, the resistance value of the electronic sound volume adjusting circuit is determined by only the resistor 45a, so that the gain of the receiving amplifier 14 (the sound volume value of the received speech signals) is the maximum. In contrast with this, when the logical "H" level signal is held at the last stage of the latch circuit 37b, since the analog switch 45p is conductive, the resistance value of the electronic sound volume adjusting circuit 45 is a sum total of the resistors 45a, 45b, 45c, 45d, 45e, 45f, 45g and 45h, so that the gain of the receiving amplifier 14 (the sound volume value of received speech signals) is the minimum. As described above, it is possible to control the sound volume value of received speech signals by changing the analog switches 45i to 45p allowed to be conductive.

Figure 6:
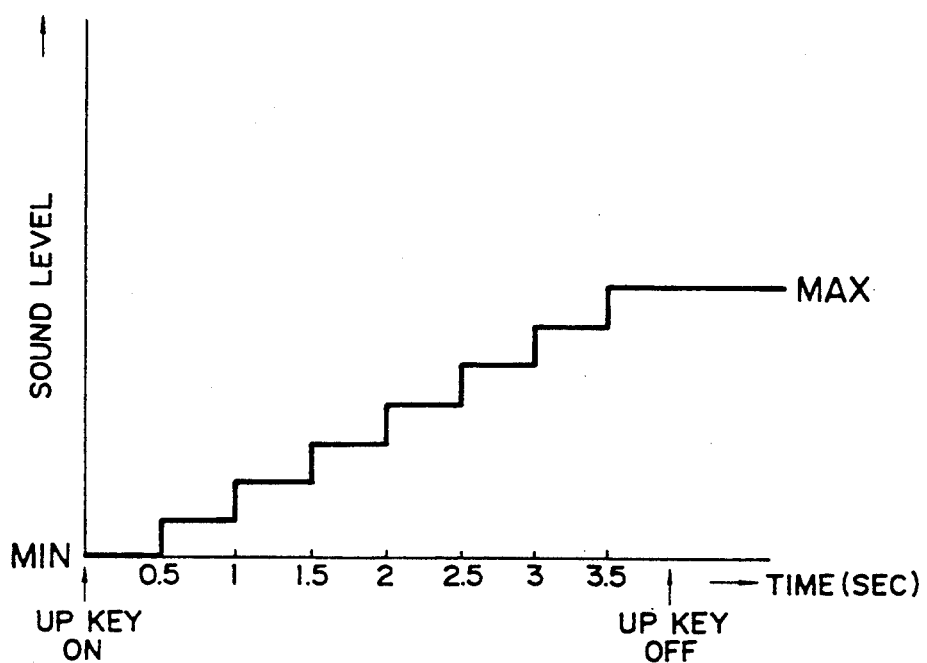
FIG. 6 is a graphical representation for assistance in explaining the sound volume control of the control circuit shown in FIG. 4.

FIG. 6 shows a change in the sound volume when the "UP" key 42 is depressed under the condition that the resistance value of the electronic sound volume adjusting circuit 45 is set to the maximum value (the minimum sound volume value). Here, the period of the clock pulse generated by the clock pulse generating circuit 39e is 0.5 sec. When the key depression time is 0.5 sec or less, since the Schmitt trigger circuit 39d is not turned on, the sound volume will not change. However, when the key depression time is 0.5 sec or more, as long as the key is kept depressed, the sound volume value increases stepwise for each 0.5 sec.

In case the user touches the "UP" or "DOWN" key 42 or 43 erroneously or an object is brought into contact with the key, since such an erroneous key depression time as described above is usually 0.5 sec or less, the sound volume will not change by the erroneous key depression.

A second embodiment of the present invention will be described hereafter. In this embodiment, in the key telephone system as shown in FIG. 7, the central control circuit 9 of the key service unit controls the sound volume of the respective key telephone sets.

Figure 7A:
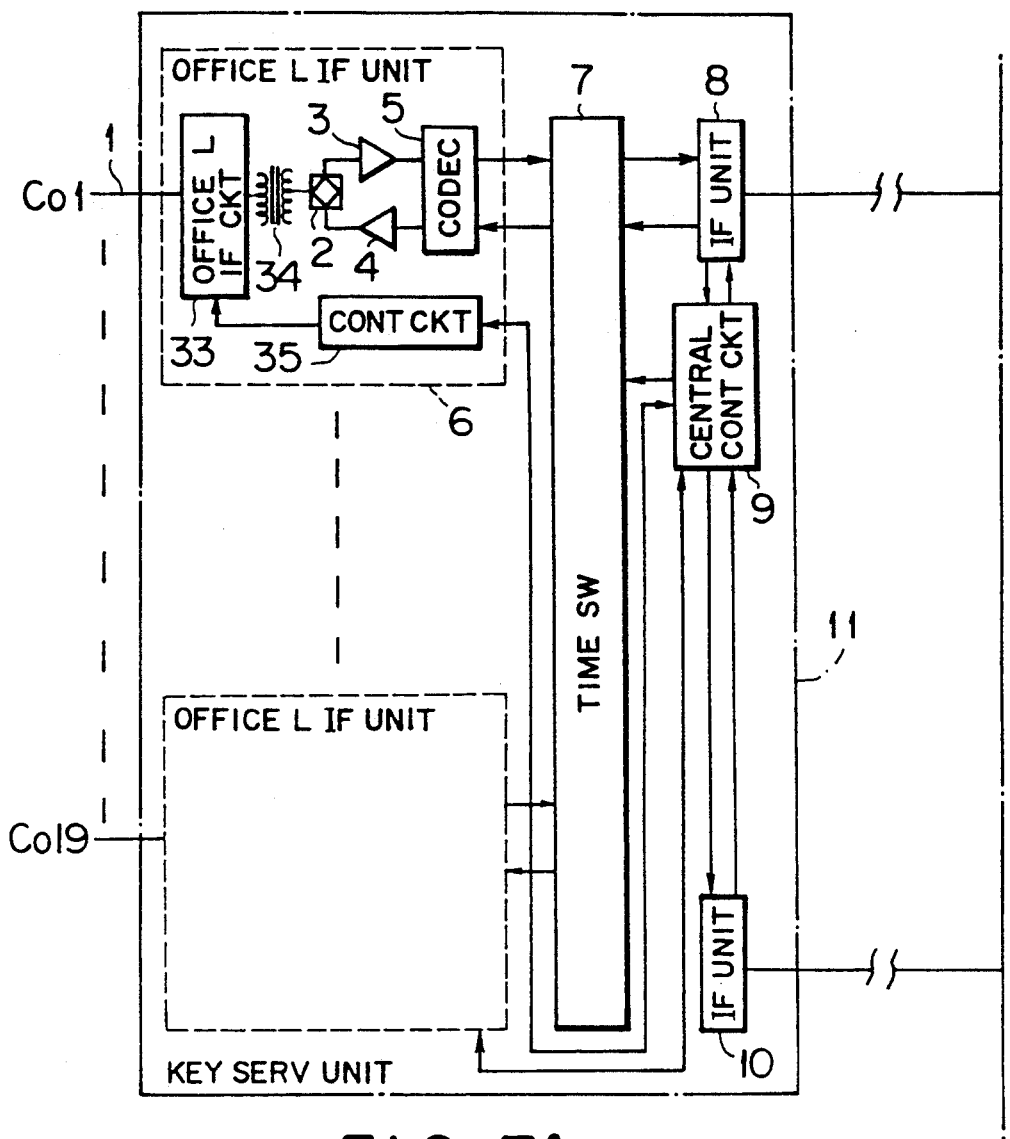
FIG. 7 (including FIGS. 7A and 7B) is a block diagram showing the entire configuration of a key telephone system, in which a second embodiment of the present invention is incorporated.
Figure 7:
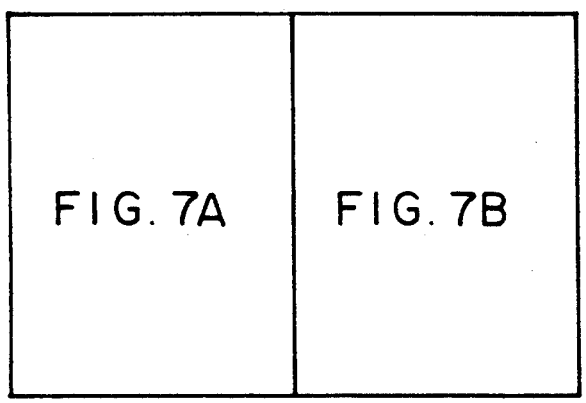
Figure 7B:
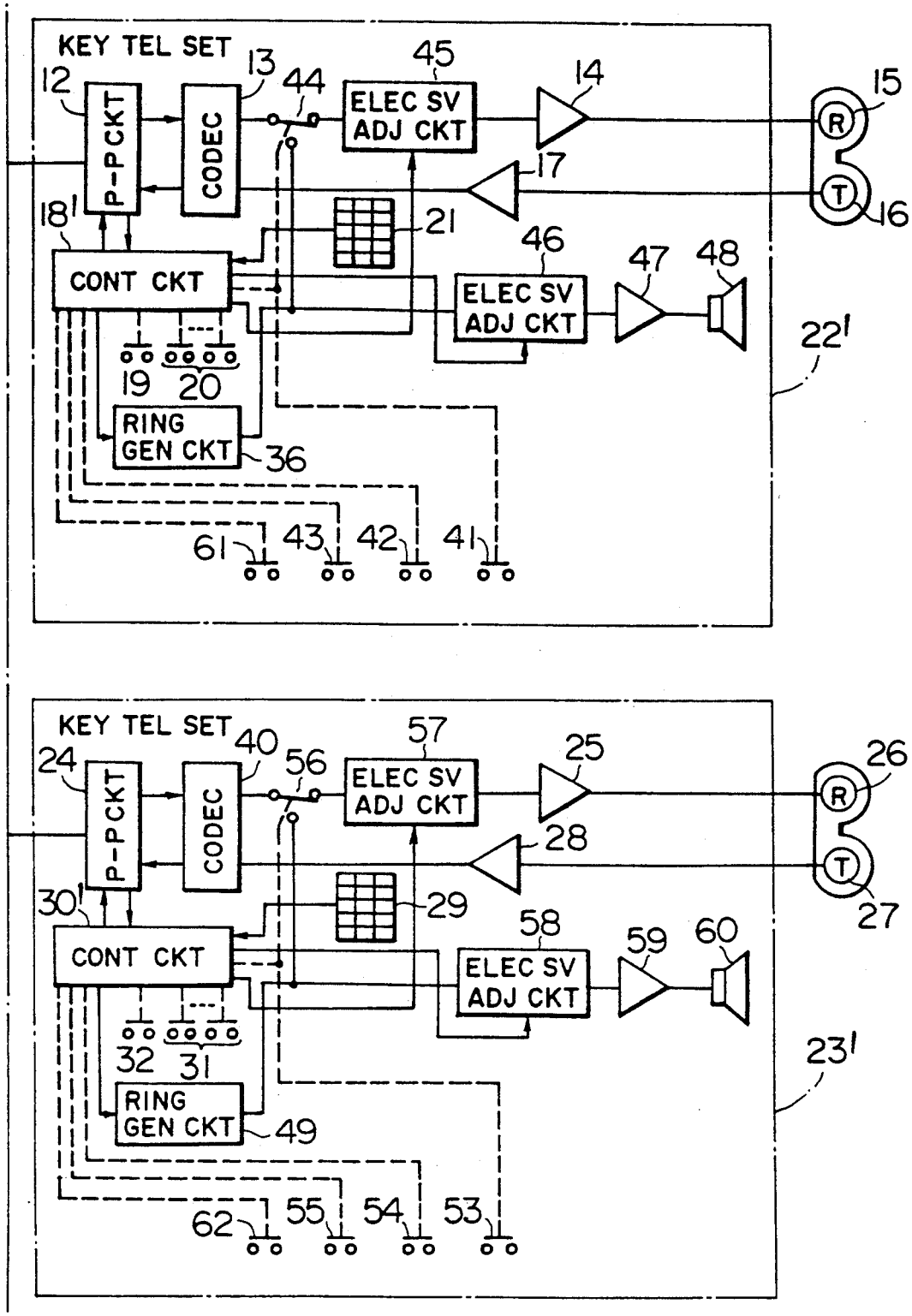

In FIG. 7 (including FIGS. 7A and 7B), the respective key telephone sets 22' and 23' are the same in circuit configuration. In the key telephone set 22', for instance, the selection key 41, the "UP" key 42, the "DOWN" key 43 and the reset key 61 are connected to the control circuit 18'. The control circuit 18' detects the depressions of these keys, and transmits the detected data to the central control circuit 9 of the key service unit 11. Further, the control circuit 18' is connected to the electronic sound volume adjusting circuits 45 and 46. The resistance value of each of these adjusting circuits is adjusted in accordance with the sound volume data given by the central control circuit 9 of the key service unit 11.

Figure 8:
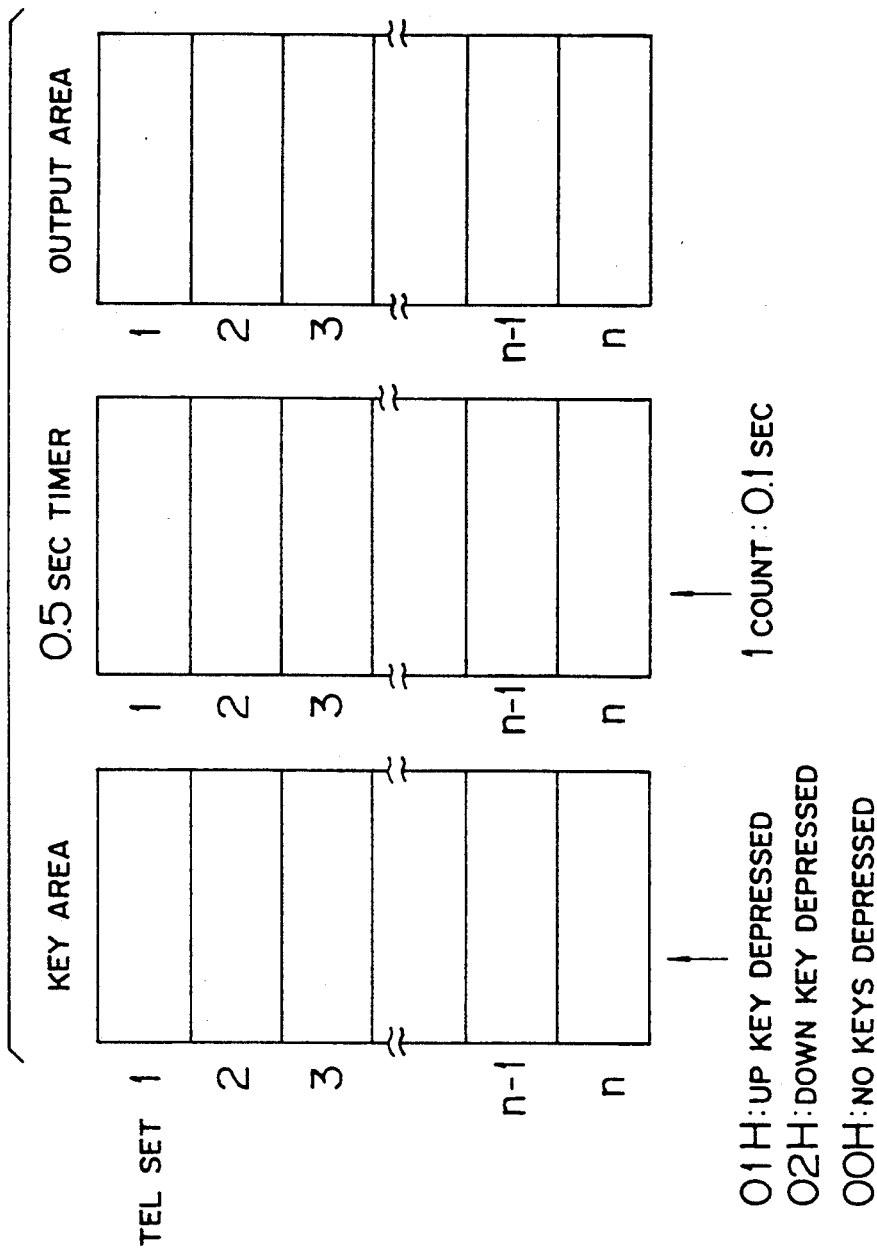
FIG. 8 is a diagram showing tables provided in a RAM of the central control circuit in a key service unit incorporated in the system shown in FIG. 7.

Memory areas as shown in FIG. 8 are set in the RAM in the central control circuit 9. The central control circuit 9 executes the processing as shown in FIG. 9.

In the RAM, there are provided a key area, a 0.5 sec timer area, and an output area as shown in FIG. 8. Each of the above-mentioned areas is divided into plural subareas corresponding to the respective key telephone sets. In the key area, a code "01H" is stored when the "UP" key is depressed in each key telephone set; a code "02H" is stored when "DOWN" key is depressed; and a code "00H" is stored when neither of the keys is depressed. In the 0.5 sec timer area, a time count value of 5 is set the instant that "UP" or "DOWN" key of each key telephone set is depressed. This time count value is decremented one by one whenever 0.1 sec has elapsed as long as the key is kept depressed. Therefore, when the key depression time reaches 0.5 sec, the time count value reaches "0" (time out). In the output area, the sound volume data obtained immediately after the 0.5 timer area is timed out is stored. Further, when the key depression is released before the 0.5 timer area is timed out, the sound volume data obtained immediately after the key is released is stored. The sound volume data of each key telephone set is read out of the output area and then transferred to the control circuit of each key telephone set.

Figure 9A:
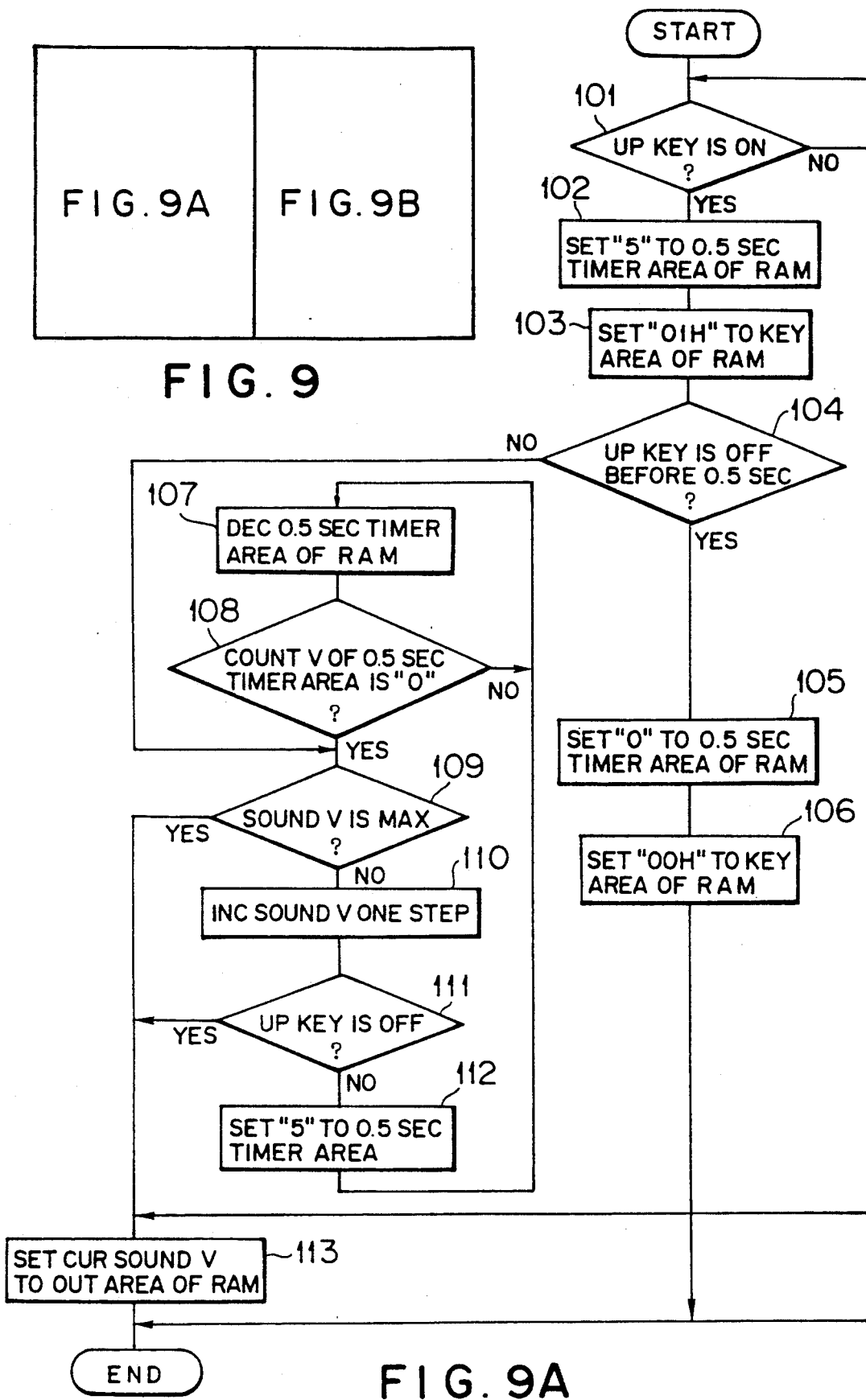
FIG. 9 (including FIGS. 9A and 9B) is a flowchart for assistance in explaining the sound volume controlling procedure of the central control circuit in the key service unit of the system shown in FIG. 7.
Figure 9B:
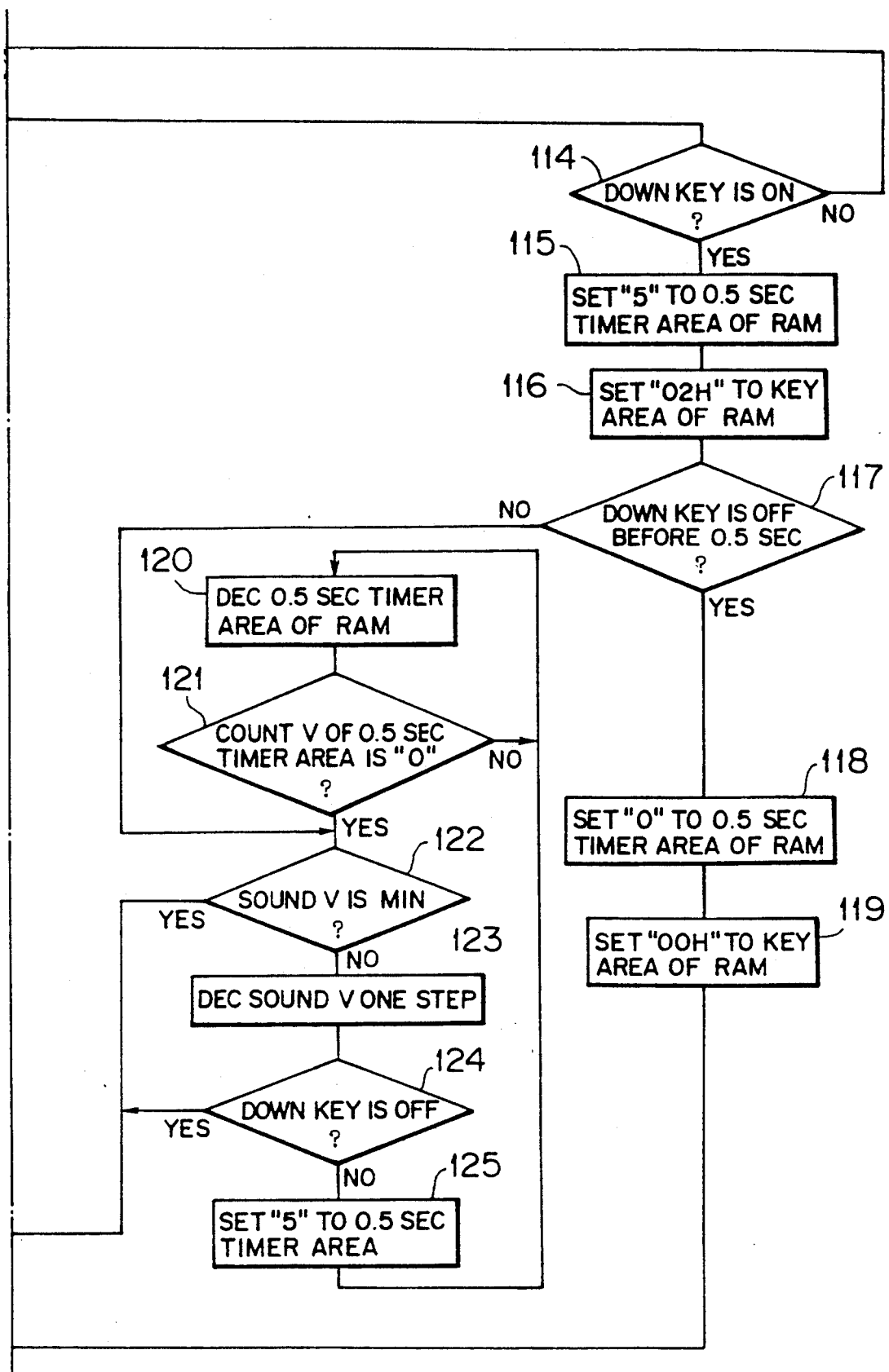

FIG. 9 (including FIGS. 9A and 9B) is a flowchart showing the operation of the central control circuit 9 executed when the "UP" or "DOWN" key is depressed. The flowchart shown in FIG. 9 will be described by taking the case of controlling the sound volume of the key telephone set 22'.

When the "UP" key 42 is depressed in the key telephone set 22', the control circuit 18' transmits the "UP" key depression data to the CPU of the central control circuit 9 (in step 101). In response to the "UP " key depression data, the CPU sets "5" to the 0.5 sec timer area of the RAM (shown in FIG. 8) (in step 102) and additionally "01H" to the key area (in step 103). Thereafter, when the depression of the "UP" key 42 is released before the elapse of 0.5 sec (in step 104), the CPU sets "0" as the count value of the 0.5 sec timer area in the RAM (in step 105) and further "00H" to the key area of the RAM (in step 106). At this time, the timer area is stopped from being decremented.

In step 104, when the depression time of the "UP" key 42 reaches 0.5 sec, the CPU proceeds to step 109. The CPU commands the control circuit 18' of the key telephone set 22' to check whether the sound volume value of the electronic sound volume adjusting circuit 45 (or 46) is the maximum (in step 109). If the sound volume value is not the maximum, the CPU commands the control circuit 18 to increment one step (a constant value) of the sound volume value of the electronic sound volume adjusting circuit 45 (or 46) (in step 110). Thereafter, the CPU checks whether the "UP" key 42 is being depressed (in step 111). If still kept depressed, the CPU sets "5" as the count value of the timer area (in step 112) and decrements the count value one by one for each one sec (in step 107). When the count value reaches zero; that is, if 0.5 sec has elapsed, the CPU proceeds to step 109 again. While the "UP" key 42 is kept depressed, the above steps 107 to 112 are repeated. As a result, the sound volume is increased in stepwise fashion as shown in FIG. 6.

This sound volume increment operation ends when the sound volume value of the electronic sound volume adjusting circuit 45 (or 46) reaches the maximum or when the depression of the "UP" key 42 is released. Upon the completion of this sound volume increment operation, the current sound volume value of the electronic sound volume adjusting circuit 45 (or 46) determined in step 110 is stored in the output area of the RAM (in step 113).

When the "DOWN" key 43 is depressed, the sound volume is decreased in stepwise fashion in the procedure similar to the case where the "UP" key is depressed (as already described) (in steps 114 to 125). In this case, if the depression time of the "DOWN" key is 0.5 sec or less, the operation of decreasing the sound volume will not start (in step 117).

In the above-mentioned embodiment, although a count value of "5" has been set to the timer area of the RAM in order to determine the delay time of 0.5 sec, it is of course possible to select any different count values in order to determine any different delay times.

A modification of the present invention applied to the key telephone system shown in FIG. 7 will be described hereinbelow.

In this modification, the speed at which the sound volume is increased or decreased can be changed according to the user's preference.

Figure 10:
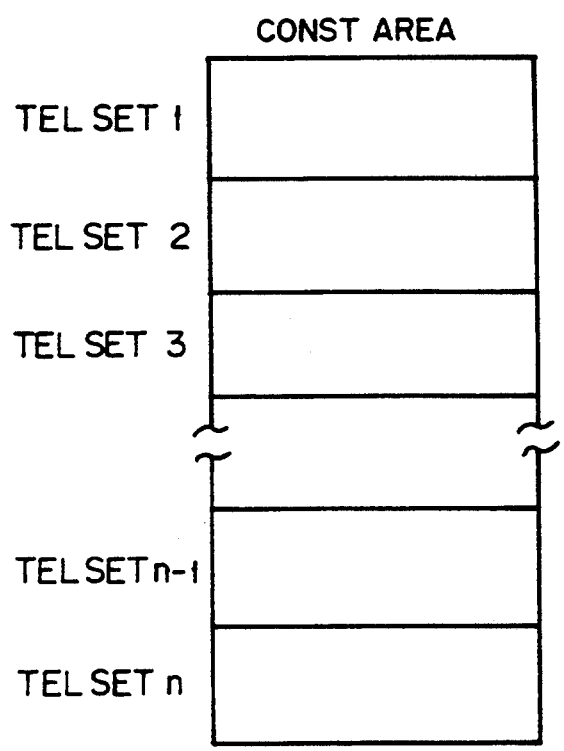
FIG. 10 is a diagram showing additional tables provided in a RAM of the second embodiment of the central control circuit in the key service unit of the system shown in FIG. 7.
Figure 11A:
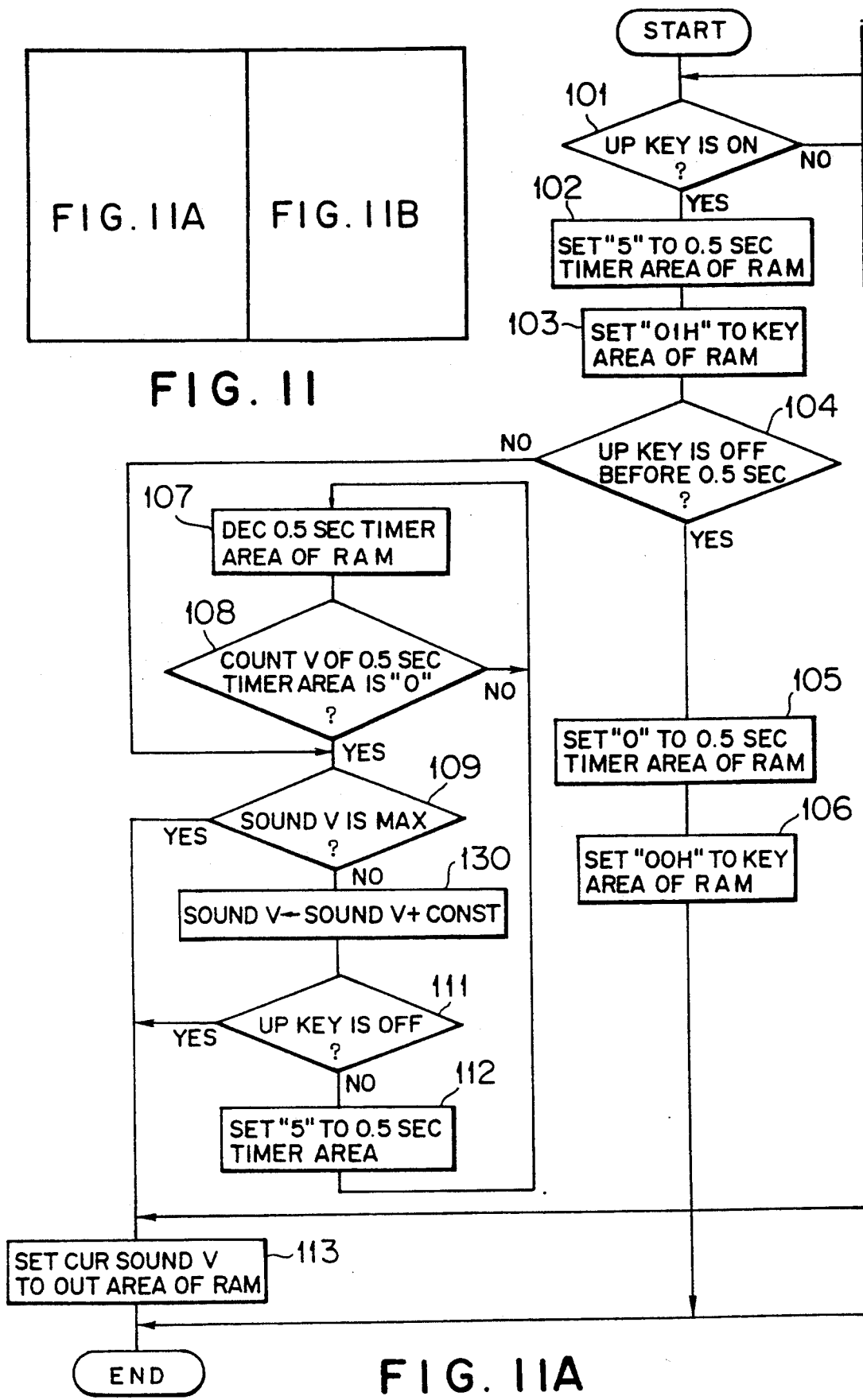
FIG. 11 (including FIGS. 11A and 11B) is a flowchart for assistance in explaining the sound volume controlling procedure of a modification of the central control circuit.
Figure 11B:
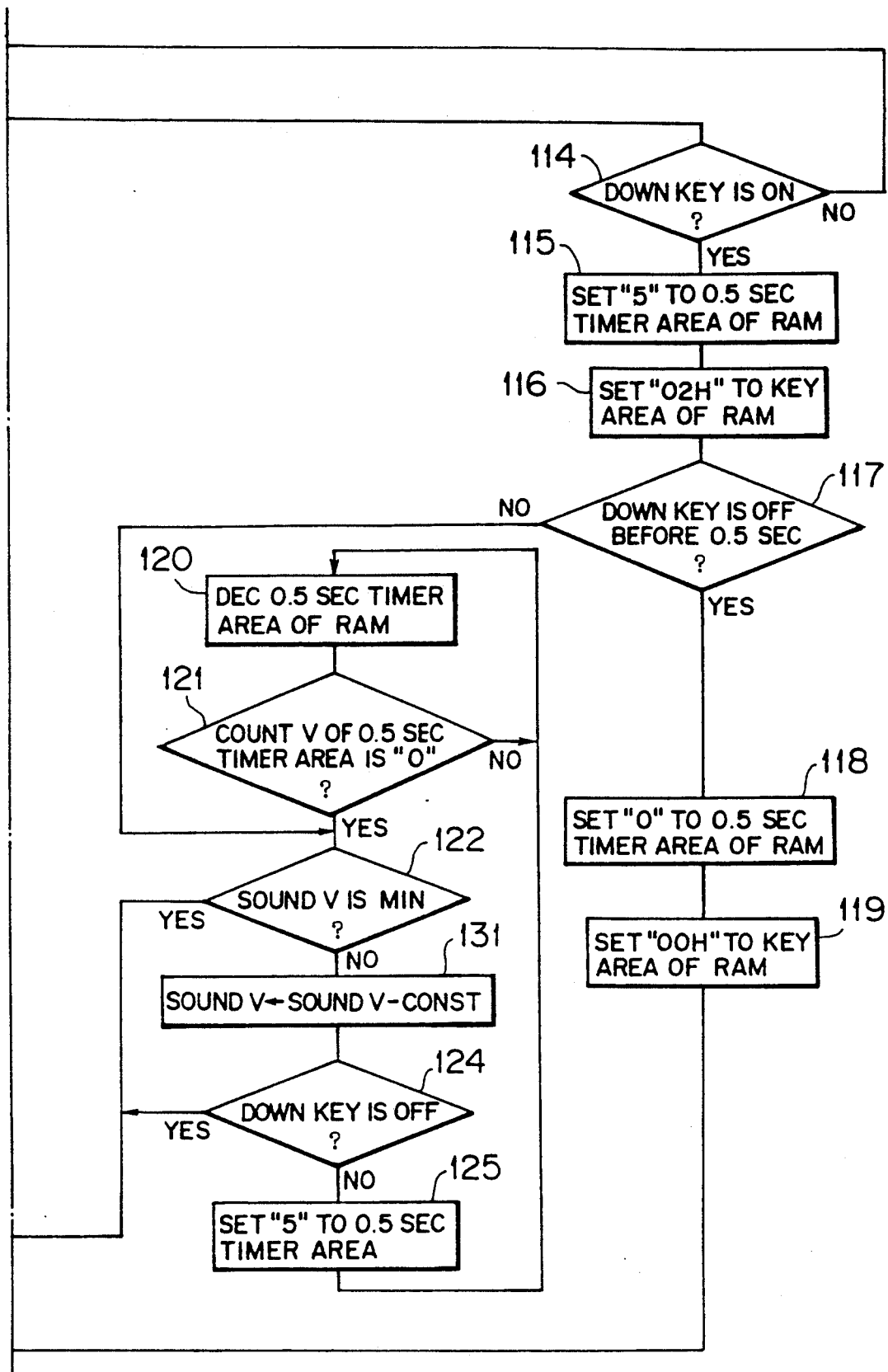

A constant area as shown in FIG. 10 is provided for the RAM in the central control circuit 9 of the key service unit 11, in addition to the areas as shown in FIG. 8. This constant area is divided into plural subareas corresponding to the respective key telephone sets. In the respective subareas, constants indicative of the respective sound volume values to be increased or decreased for each step are stored so as to correspond to the key telephone sets, respectively FIG. 11 (including FIGS. 11A and 11B) shows a flowchart for assistance in explaining the procedure of controlling sound volume by the central control circuit 9 in this modification. This flowchart shown in FIG. 11 is the same as that shown in FIG. 9, except for steps 130 and 131 at which the sound volume is increased or decreased. In step 130 (or step 131), a new sound volume value is determined by adding (or subtracting) a constant read from the constant area shown in FIG. 10 to (or from) the current sound volume value, so that the sound volume value is increased or decreased stepwise on the basis of a constant stored in the constant area according to the user's preference.

Figure 12:
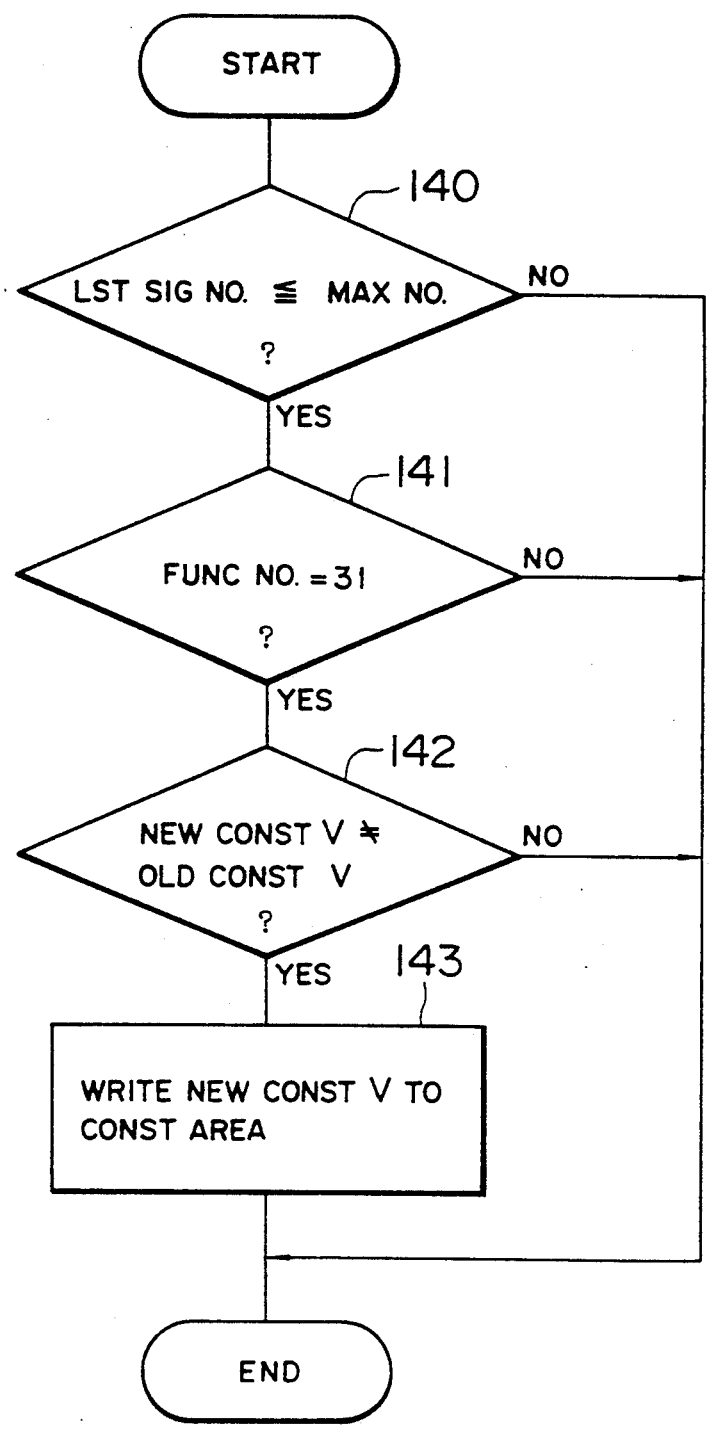
FIG. 12 is a flowchart for assistance in explaining the setting procedure of sound volume increase/decrease rate in the modification of the central control circuit.

FIG. 12 is a flowchart showing the procedure of the central control circuit 9 to rewrite the constant stored in the constant area shown in FIG. 10. This procedure starts in response to a control data generated when the user depresses a predetermined combination of keys in any one of the key telephone sets.

The CPU first checks whether the least significant figure of the received control data is less than a predetermined maximum number (in step 140). If the checked result is YES, the CPU checks the function selecting number included in the control data (in step 141). For instance, where "31" is the function selecting number for setting a step value by which the sound volume is increased or decreased, if the function selecting number included in the control data is "31", the CPU proceeds to step 142. In step 142, the CPU checks whether the new constant value included in the control data matches the constant value already stored in the constant area. If both match each other, the processing ends. If they do not match, the CPU writes the new constant value to the constant area in the RAM. As described above, any constant value (i.e. sound volume increase/decrease rate) given by the user can be stored in the constant area, and thereafter the sound volume is increased or decreased in accordance with the rate determined by the user.

Another modification of the present invention applied to the system shown in FIG. 7 will be explained hereinbelow. In this modification, the sound volume can be increased or decreased in accordance with a geometrical progression, which is preferable to allow the user to feel the change in sound volume at a constant rate under due consideration of human's acoustic sense.

In this modification, the constant area as shown in FIG. 10 is provided for the ROM in the central control circuit 7. A sound volume change ratio (constants larger than 1 and smaller than 2 is usual) is stored in the respective subareas of the constant area.

Figure 13:
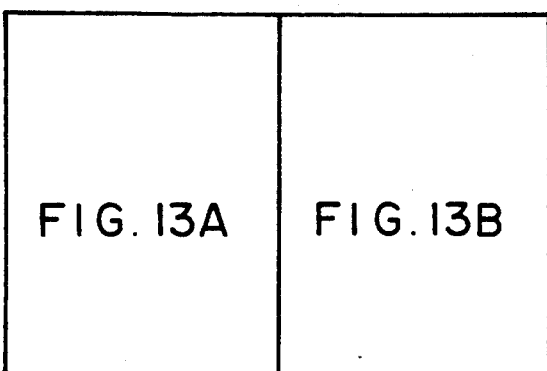
FIG. 13 (including FIGS. 13A and 13B) is a flowchart for assistance in explaining the sound volume controlling procedure of another modification of the central control circuit of the present invention incorporated in the system shown in FIG. 7.
Figure 13A:
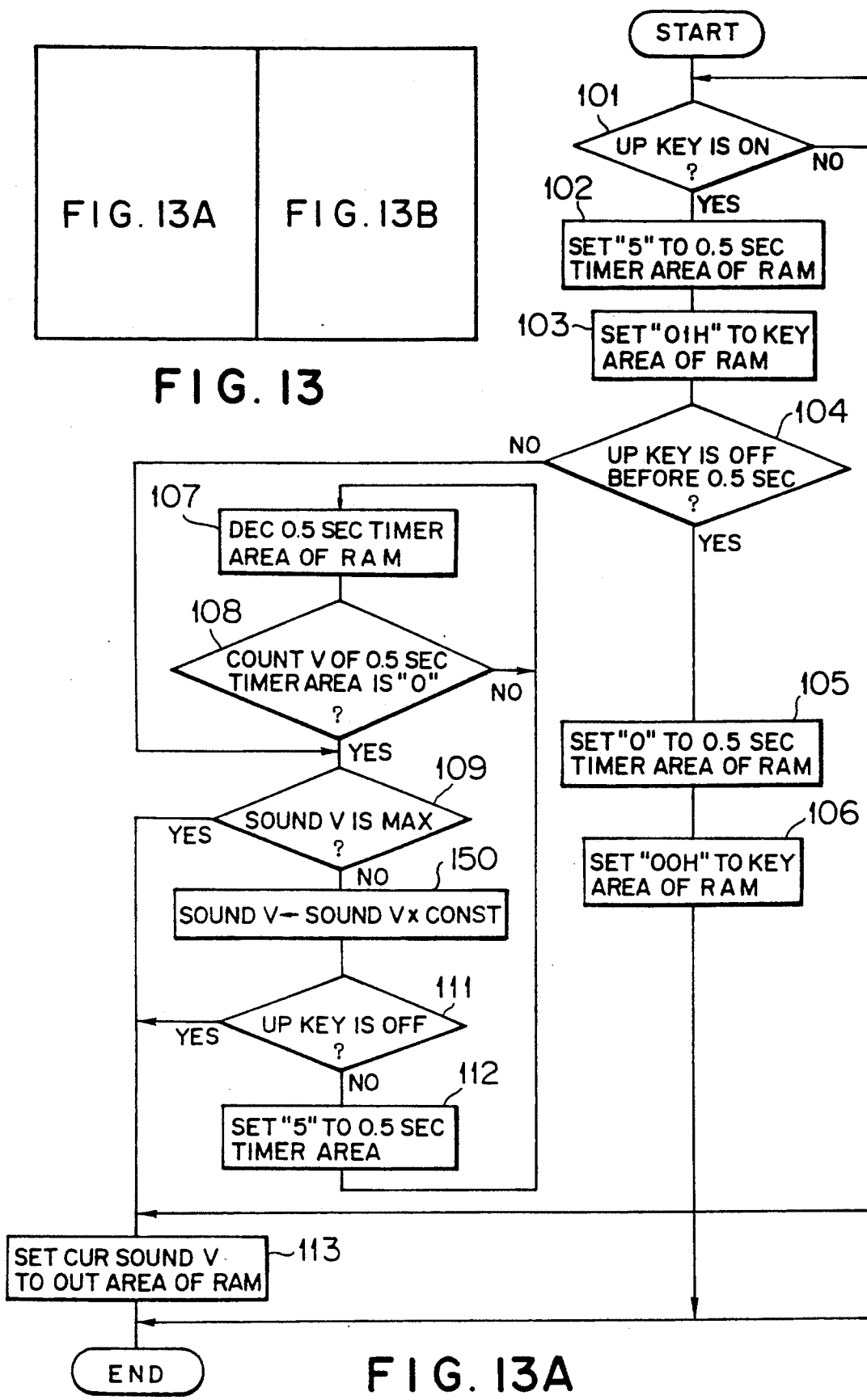
Figure 13B:
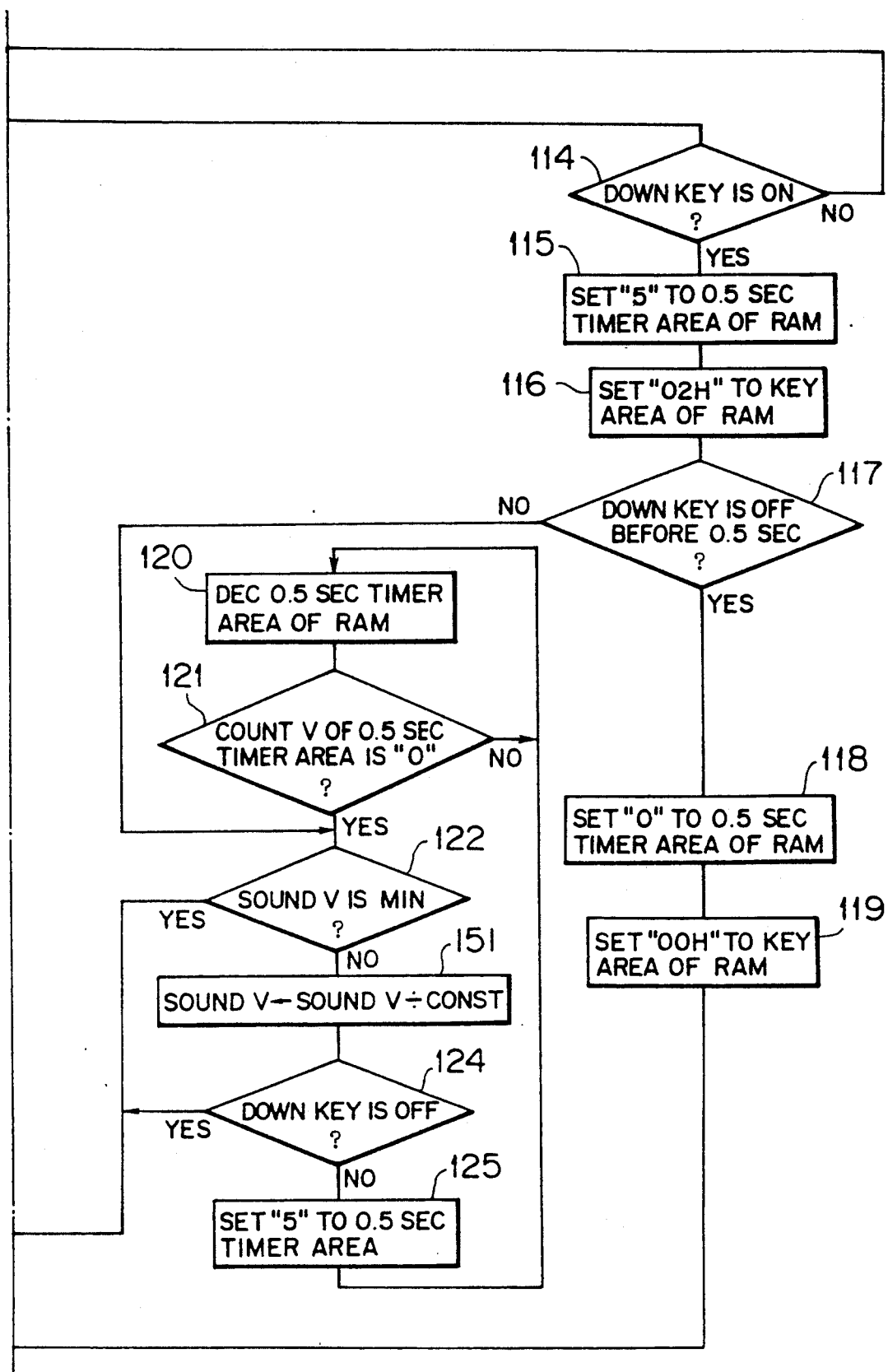

FIG. 13 (including FIGS. 13A and 13B) is a flowchart showing the procedure of controlling the sound volume by the central control circuit 7 in this modification. This flowchart is the same as that shown in FIG. 9, except the steps 150 and 151 at which for sound volume is increased or decreased. In step 150 (or 151), a new sound volume value is determined by multiplying a ratio read from the constant area to the current sound volume value or by dividing the current sound volume by the read ratio. Since the sound volume is increased or decreased in geometrical progression, the human acoustic sense feels that sound volume changes at a constant rate.

In this modification, it is possible to determine a sound volume change ratio according to the user's preference by executing the processing procedure as shown in FIG. 12.

What is claimed is:

1. A sound volume controlling apparatus comprising:
   key means operable manually for controlling the sound volume;
   time period detecting means coupled to said key means for detecting a time period of continuous operation of said key means, said time period beginning after a predetermined constant delay time and ending when the continuous operation of said key means ends;
   sound volume value determining means coupled to said time period detecting means for changing a sound volume value during the time period detected by said time period detecting means; and
   sound volume changing means coupled to said sound volume determining means for changing sound volume in accordance with the sound volume value determined by said sound volume value determining means.

2. The apparatus of claim 1, wherein said time period detecting means comprises:
   voltage generating means for continuously generating a constant voltage signal when said key means is being operated;
   integrating means for integrating the constant voltage signal generated by said voltage generating means and generating an output signal responsive to the constant voltage signal; and
   detection signal generating means coupled to said integrating means for generating a detection signal when the output signal exceeds a predetermined threshold value.

3. The apparatus of claim 1, wherein said sound volume value determining means comprises:
   clock means for generating a clock pulse;
   gate means coupled to said time period detecting means and said clock means for passing the clock pulse generated by said clock means therethrough only during the time period detected by said time period detecting means; and
   stepwise changing means coupled to said gate means for stepwise changing the sound volume value in synchronism with the clock pulse passed through said gate means.

4. The apparatus of claim 1, wherein the apparatus comprises a microcomputer coupled to said key means and said sound volume changing means, said microcomputer including said time period detecting means and said sound volume value determining means.

5. The apparatus of claim 4, wherein said sound volume value determining means comprises:
   memory means for storing a sound volume varying unit value;
   timer means for repeatedly counting a predetermined period during the time period detected by said time period detecting means; and
   sound volume value changing means for changing the sound volume value by adding or subtracting the sound volume varying unit value stored in said memory means to or from the sound volume value for each predetermined period counted by said timer means.

6. The apparatus of claim 5, further comprising means for changing the sound volume varying unit value.

7. The apparatus of claim 4, wherein said sound volume value determining means comprises:
   memory means for storing a sound volume varying ratio;
   timer means for repeatedly counting a predetermined period during the time period detected by said time period detecting means; and
   sound volume value changing means for changing the sound volume value by multiplying the sound volume varying ratio stored in said memory means to the sound volume value or by dividing the sound volume value by the sound volume varying ratio, for each predetermined period counted by said timer means.

8. The apparatus of claim 7, further comprising means for changing the sound volume varying ratio.

9. The apparatus of claim 4, wherein the sound volume controlling apparatus is incorporated in a key telephone system including a key service unit and at least one key telephone set connected to the key service unit; wherein the key service unit includes the microcomputer; the key telephone set includes said key means and said sound volume changing means; and said sound volume changing means is provided to control sound volume of at least one of received speech sound and ringing sound of the key telephone set.

10. A sound volume controlling apparatus, comprising:
    key means operable manually for controlling sound volume;
    time period detecting means coupled to said key means for detecting a time period of continuous operation of said key means, said time period beginning after a predetermined constant delay time and ending when the continuous operation of said key means ends;
    wherein the time period detecting means comprises:
      voltage generating means for continuously generating a constant voltage signal when said key means is being operated;
      integrating means for integrating the constant voltage signal generated by said voltage generating means and generating an output signal responsive to the constant voltage signal; and
      detection signal generating means coupled to said integrating means for generating a detection signal when the output signal exceeds a predetermined threshold value;
    sound volume value determining means coupled to said time period detecting means for changing a sound volume value during the time period detected by said time period detecting means; and
    sound volume changing means coupled to said sound volume determining means for changing sound in accordance with the sound volume value determined by said sound volume value determining means.

11. The apparatus of claim 10, wherein said sound volume value determining means comprises:
    clock means for generating a clock pulse;
    gate means coupled to said time period detecting means and said clock means for passing the clock pulse generated by said clock means therethrough only during the time period detected by said time period detecting means; and stepwise changing means coupled to said gate means for stepwise changing the sound volume value in synchronism with the clock pulse passed through said gate means.

12. A sound volume controlling apparatus, comprising:

key means operable manually for controlling sound volume;

time period detecting means coupled to said key means for detecting a time period of continuous operation of said key means, said time period beginning after a predetermined delay time and ending when the continuous operation of said key means ends;

sound volume value determining means coupled to said time period detecting means for changing a sound volume value during the time period detected by said time period detecting means;

sound volume changing means coupled to said sound volume determining means for changing sound in accordance with the sound volume value determined by said sound volume value determining means; and a microcomputer coupled to said key means and said sound volume changing means, said microcomputer including said time period detecting means and said sound volume value determining means;

wherein said sound volume value determining means comprises:

memory means for storing a volume varying ratio;

timer means for repeatedly counting a predetermined period during the time period detected by said time period detecting means; and sound volume value changing means for changing the sound volume value by multiplying the sound volume varying ratio stored in said memory means to the sound volume value or by dividing the sound volume value by the sound volume varying ratio, for each predetermined period counted by said timer means.

13. The apparatus of claim 12, further comprising means for changing the sound volume varying ratio.

14. The apparatus of claim 12, wherein the sound volume controlling apparatus is incorporated in a key telephone system including a key service unit and at least one key telephone set connected to the key service unit; wherein the key service unit includes the microcomputer; the key telephone set includes said key means and said sound volume changing means; and said sound volume changing means is provided to control sound volume of at least one of received speech sound and ringing sound of the key telephone set.

* * * * *